United States Patent [19]

Konishi

[11] Patent Number: 5,319,325

[45] Date of Patent: Jun. 7, 1994

[54] S/M ENHANCER

[75] Inventor: Yoshihiro Konishi, Sagamihara, Japan

[73] Assignee: Uniden Corporation, Ichikawa, Japan

[21] Appl. No.: 22,293

[22] Filed: Feb. 25, 1993

[30] Foreign Application Priority Data

Mar. 2, 1992 [JP] Japan .................................. 4-044788

[51] Int. Cl.$^5$ .............................................. H03H 7/34
[52] U.S. Cl. ..................................... 333/17.2; 333/33; 333/109
[58] Field of Search ............... 333/109, 201, 202, 156, 333/33

[56]  References Cited

U.S. PATENT DOCUMENTS 4,283,692  8/1981  Adam ................................ 333/17 L
4,392,115  6/1983  Vollvet et al. .

FOREIGN PATENT DOCUMENTS 0438124  7/1991  European Pat. Off. .
0189002  7/1990  Japan .

Primary Examiner—Benny Lee
Assistant Examiner—Darius Gambino
Attorney, Agent, or Firm—Stevens, Davis, Miller & Mosher

[57] ABSTRACT

To overcome conventional increase of insertion loss and conventional discrepancy of phase characteristic of an S/N enhancer provided for increasing S/N of an electro-magnetic wave to be converted into a magneto-static wave by utilizing saturation of magneto-static wave power propagating through a ferrite thin film, a novel operational principle is used, wherein a large variation of impedance of a strip line, provided for converting electro-magnetic waves into magneto-static waves in the vicinity of saturation of the magneto-static wave. The electro-magnetic wave reflected from the input terminal of the strip line is selectively derived as an output wave through a directional coupling device.

As a result, particularly for an electro-magnetic wave applied with wide-band FM modulation, S/N can be remarkably increased without any increase of insertion loss or any influence of phase characteristic discrepancy.

8 Claims, 7 Drawing Sheets

FIG_1
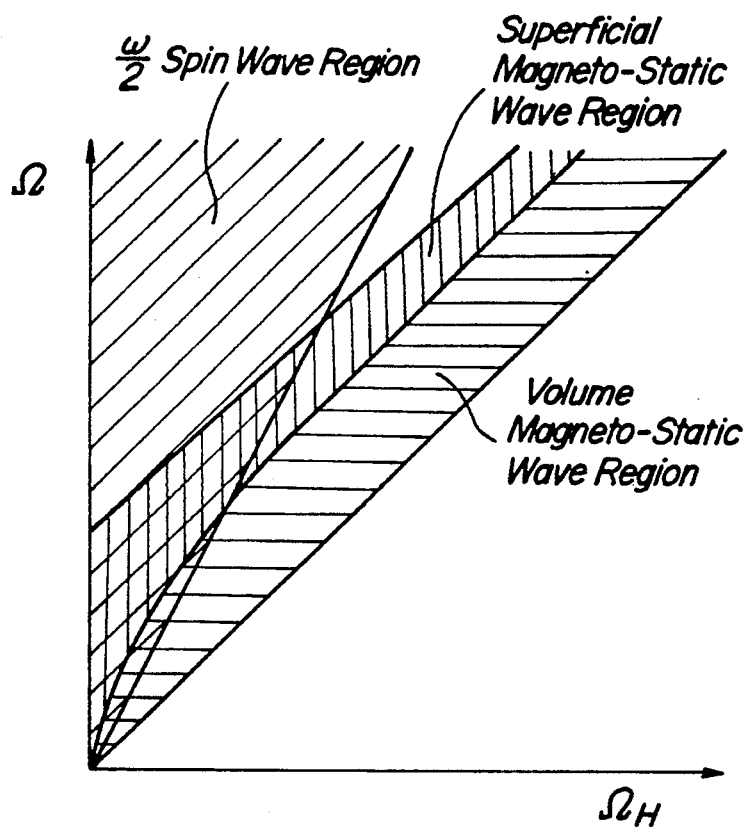
FIG_2
PRIOR ART
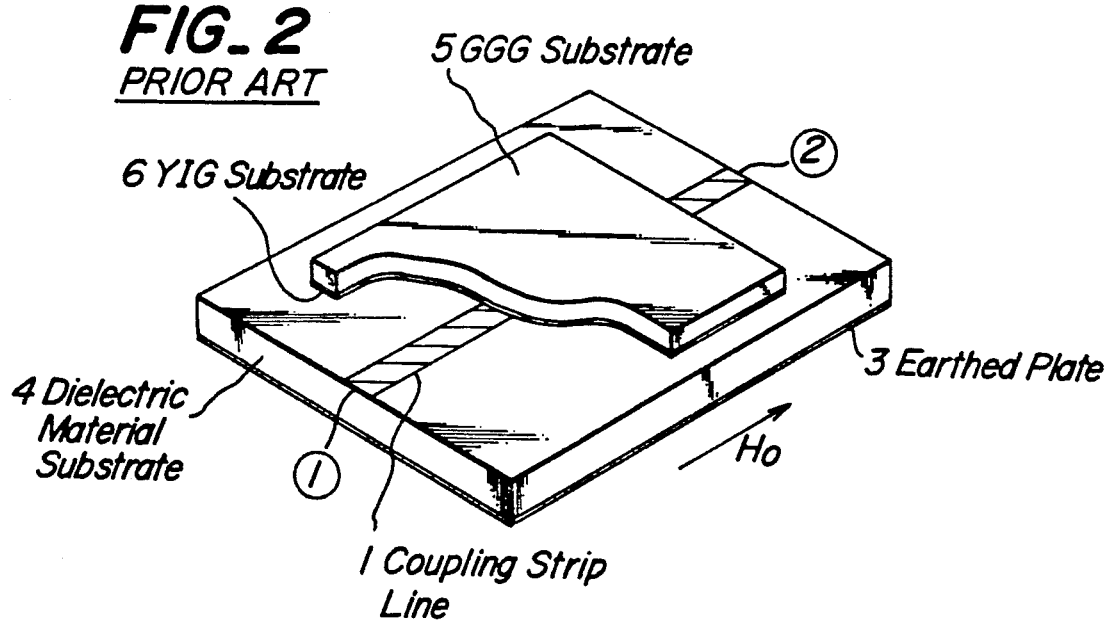

FIG_4
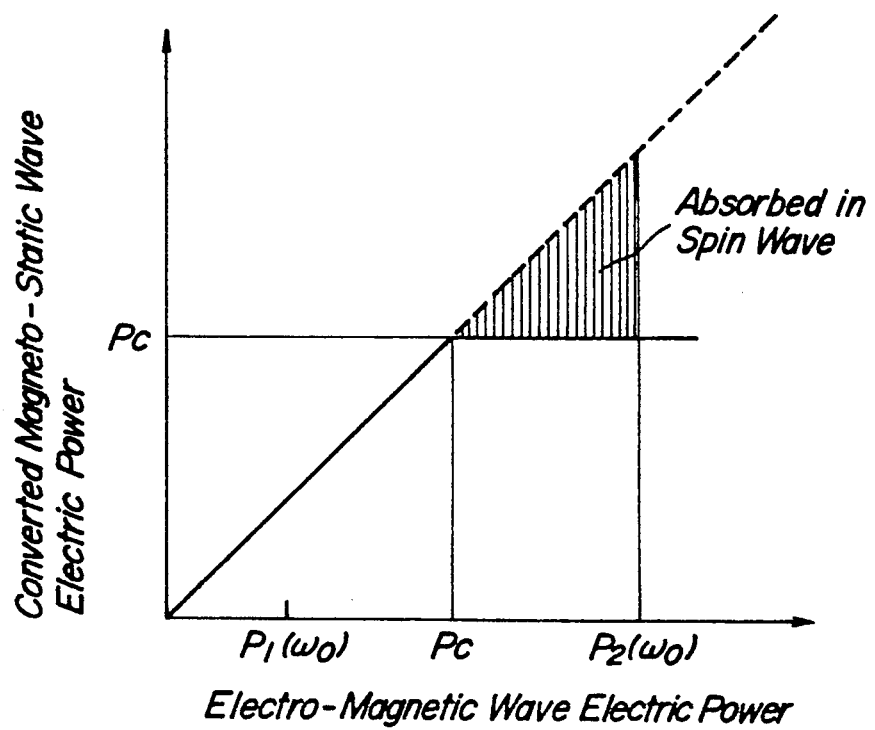

FIG_5(a)
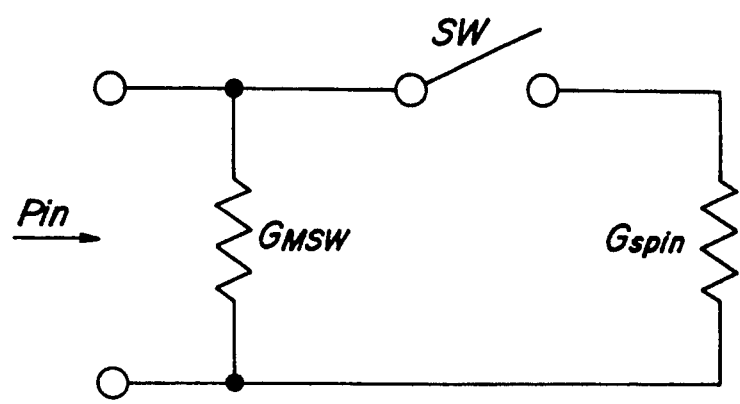
FIG_5(b)
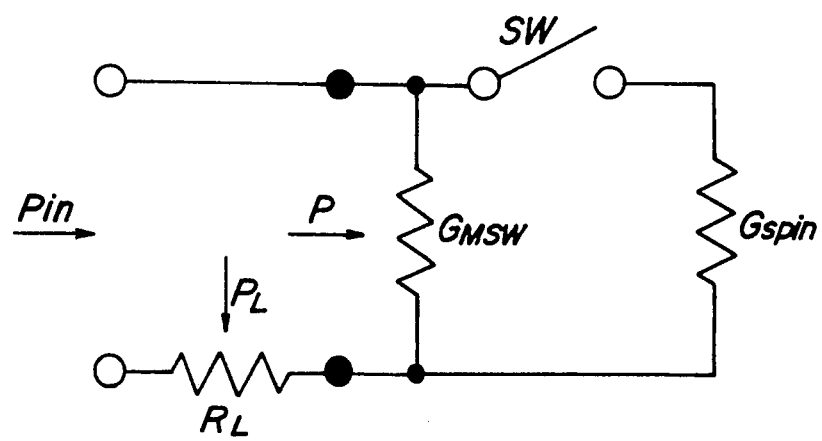

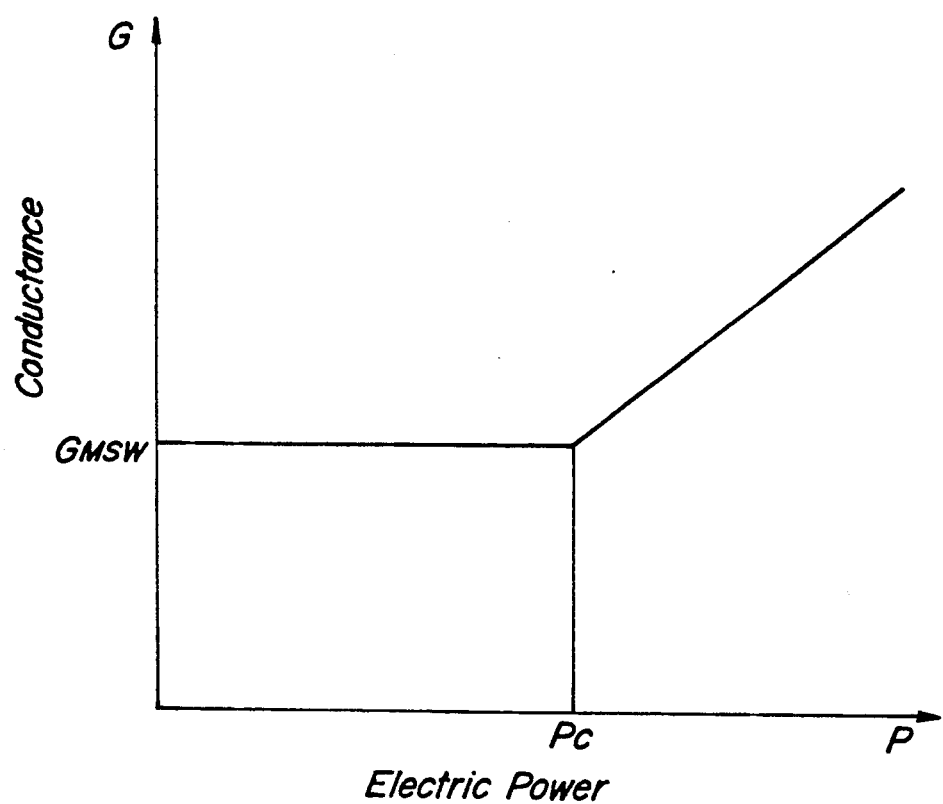
FIG_6

FIG_7(a)
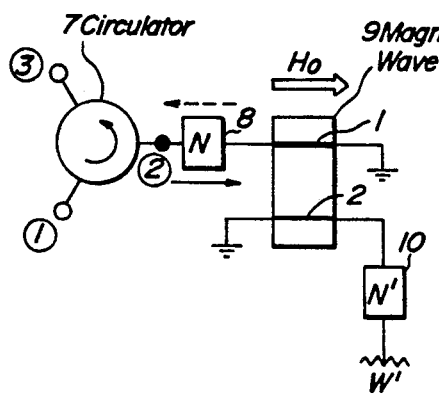
FIG_7(c)
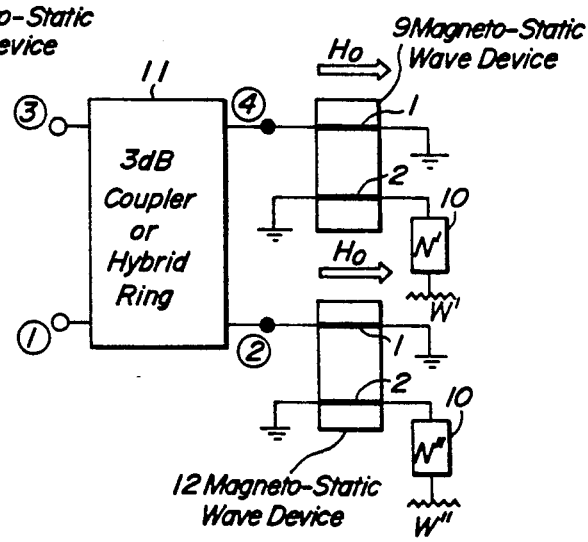
FIG_7(b)
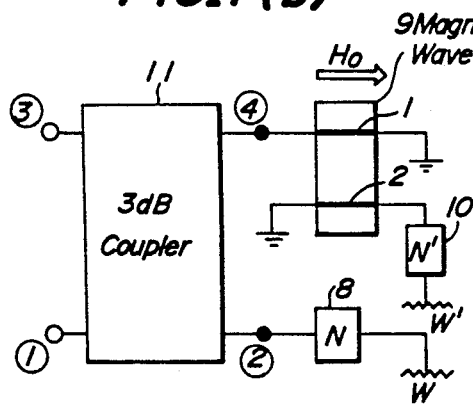
FIG_7(d)
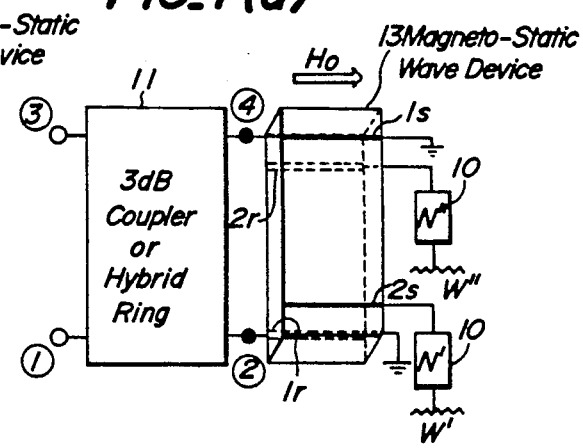

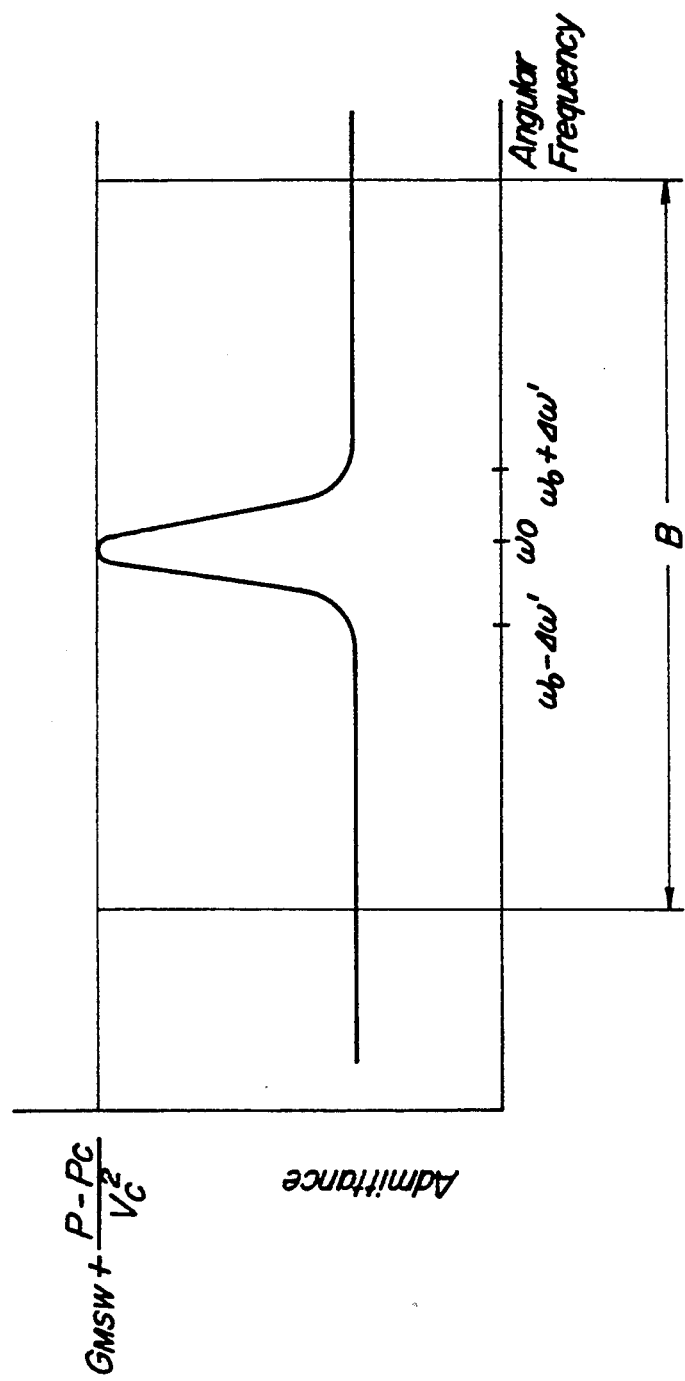
FIG_8

S/M ENHANCER

BACKGROUND OF THE INVENTION

1. Field of the Invention

The present invention relates to an S/N enhancer which utilizes a magneto-static wave device for increasing a signal to noise ratio (S/N) of a high frequency electro-magnetic wave signal (e.g. a micro-wave signal) by utilizing the saturation of a magneto-static wave converted from an electro-magnetic wave, which propagates through a thin film of ferri-magnetic material (e.g. a ferrite thin film), so as to efficiently improve the S/N of the original signal without any increase of insertion loss thereof in a transmission path.

2. Related Art Statement

The magneto-static wave propagating through the ferrite thin film in the magneto-static wave device of this kind, particularly a superficial magneto-static wave propagating along the film surface thereof, is readily saturated even in a small amplitude region thereof. So that, the device of this kind presents a non-linear input-to-output characteristic for an electro-magnetic wave which has an electric power as large as that of the magneto-static wave converted therefrom exceeds the threshold of saturation, while it presents a linear input-to-output characteristic for the electro-magnetic wave which has an electric power as small as that of the magneto-static wave converted therefrom which does not reach to the threshold of saturation.

In this connection, a conventional S/N enhancer has been developed in which, according to the utilization of the magneto-static wave device presenting the aforesaid input-to-output characteristics, noise components among an input electro-magnetic wave which don't reach the threshold of saturation are entirely consumed through the conversion into the magneto-static wave, while signal components which do exceed the threshold of saturation are passed through, so as to increase the signal-to-noise ratio. However, according to this conventional development, a sufficient increase of S/N could not be attained because of the impedance variation caused as described in detail later and the like.

In connection with the above, another conventional S/N enhancer has been developed utilizing the magneto-static wave. In such a S/N enhancer, two channels are provided, which respectively present the aforesaid non-linear and linear input-to-output characteristics, by replacing the order of series connection with each other between a magneto-static wave device and an attenuator and are separately supplied with the same input electro-magnetic wave. The respective outputs of these two channels are mixed with each other, such that noise components thereof are canceled by each other, so as to increase the signal-to-noise ratio thereof.

However, in these conventional S/N enhancers utilizing magneto-static waves, because the input-to-output characteristic is based on an extremely low threshold of saturation of the magneto-static wave propagating through the ferrite thin film, as for the channel presenting the linear input-to-output characteristic, the attenuator is prefaced to prevent the saturation of the magneto-static wave device. Hence, the output level of the mixed electro-magnetic wave, from which noise components are canceled, is extremely lowered. As a result, the insertion loss of the S/N enhancer is extremely increased. In addition, another defect of this S/N enhancer is that when the electric power levels of the electro-magnetic waves individually supplied to the magneto-static wave devices in the two channels differ greatly from each other, a discrepancy is caused between respective phase characteristics thereof, so that a electro-magnetic-wave having an excessively large electric power can not be supplied to this S/N enhancer. Consequently, the prevention of the effect of the discrepancy of the phase characteristic without any increase of the insertion loss is the conventional problem to be solved as for an S/N enhancer of this kind utilizing magneto-static waves.

SUMMARY OF THE INVENTION

An object of the present invention is to solve the above conventional problem and to provide an S/N enhancer utilizing a magneto-static wave, which facilitates efficient raising of the signal-to-noise ratio of the electro-magnetic wave, without increasing insertion loss or the discrepancy of phase characteristic.

An S/N enhancer according to the present invention, which utilizes the saturation of a magneto-static wave converted from an electro-magnetic wave supplied to a strip electrode disposed on a ferrite thin film applied with a DC magnetic field and propagating through the ferrite thin film, differs from the conventional one utilizing a non-linear input-to-output characteristic based on the saturation of the magneto-static wave, and hence utilizes the reflection of the supplied electro-magnetic wave which is caused by an extreme impedance variation of the converting strip electrode in the vicinity of the threshold of saturation, which is based on the saturation of the magneto-static wave converted from the supplied electro-magnetic wave.

In other words, the S/N enhancer according to the present invention, in which a strip line is provided on a surface of a ferri-magnetic material thin film disposed on a dielectric material substrate for coupling with a superficial magneto-static wave propagating along both of the film surfaces perpendicularly to a DC magnetic field applied thereon in parallel with the film surface and an electro-magnetic wave is supplied on one end of the strip line, is featured in that, when an electro-magnetic wave, to be converted into a magneto-static wave having an electric power exceeding the saturated electric power, is supplied to one end of strip line from an electro-magnetic wave supplying source having an internal resistance equal to the impedance of the strip line in a state in which a magneto-static wave having an electric power, which does not exceed the saturated electric power, propagates therethrough, the signal-to-noise ratio (S/N) of the electro-magneto wave supplied from said source is increased in response to the impedance variation of said strip line by selectively deriving the electro-magnetic wave which is reflected from the one end of the strip line.

Consequently, in the S/N enhancer according to the present invention, it is possible to greatly increase the signal-to-noise ratio of the electro-magnetic wave with an favorable efficiency and without increasing insertion loss or the discrepancy of phase characteristic.

BRIEF DESCRIPTION OF THE DRAWINGS

For a better understanding of the invention, reference is made to the accompanying drawings, in which:

FIG. 1 is a characteristic curve showing frequency-to-magnetic field characteristics ($\Omega - \Omega_H$ characteristics) of magneto-static waves of various kinds;

FIG. 2 is a perspective view schematically showing an outlined arrangement of magneto-static wave devices in general;

FIG. 4 is a characteristic curve showing input-to-output characteristics of electric power levels of an input electro-magnetic wave and a converted output magneto-static wave;

FIGS. 5(a) and 5(b) are circuit diagrams showing equivalent circuits of the magneto-static wave device when an electric power of an input electro-magnetic wave does not reach to the threshold of saturation and when it does exceed the threshold of saturation, respectively;

FIG. 6 is a characteristic curve showing the relation between an input conductance and an input carrier wave electric power in the magneto-static wave device;

FIGS. 7(a), 7(b), 7(c) and 7(d) are block diagrams schematically showing various examples of an outlined arrangement of an S/N enhancer according to the present invention, respectively; and FIG. 8 is a characteristic curve showing an example of a frequency characteristic of an input admittance into the magneto-static wave device.

Figure 3A:
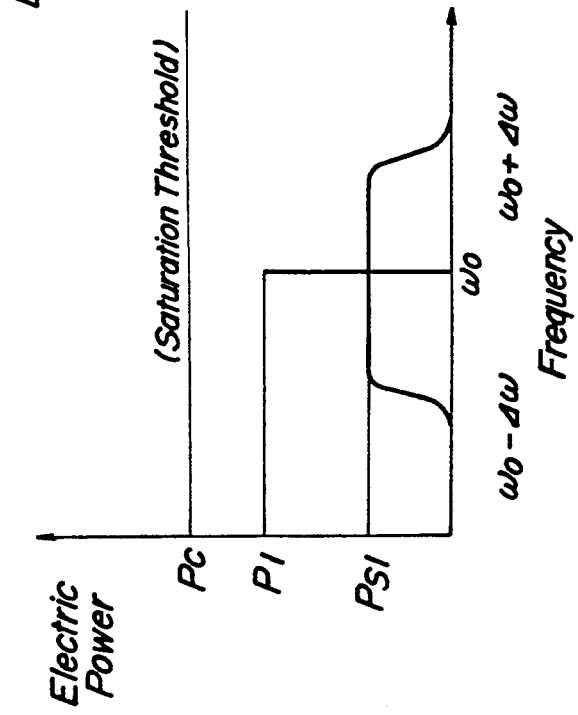
FIGS. 3(a) and 3(b) are characteristic curves showing electric power-to-frequency characteristics when an electric power of an input carrier wave does not exceed the threshold of saturation and when it does exceed the threshold of saturation, respectively.

Throughout different views of the drawing, 1, $1_s$, $1_r$ are coupling strip lines; 2, $2_s$, $2_r$ are terminating strip lines; 3 is an earthed (ground) plate; 4 is a dielectric material substrate; 5 is a dielectric material (GGG) substrate; 6 is a ferri-magnetic material (YIG) substrate; 7 is a circulator; 8, 10 are matching circuits; 9, 12 are magneto-static wave devices; 11 is a 3 dB coupler or a hybrid ring; and 13 is a ferri-magnetic material thin film.

DESCRIPTION OF THE PREFERRED EMBODIMENTS

Preferred embodiments of the present invention will be described in detail hereinafter by referring to the accompanying drawings.

The present invention will be described in detail by beginning with the operational principle of an S/N enhancer utilizing a magneto-static wave, in the case where an electro-magnetic wave and a magnetic-static wave are coupled with each other through a strip line disposed on a ferri-magnetic material thin film (e.g. a ferrite thin film), which is applied with a DC magnetic field, when an electric power of the electro-magnetic wave supplied to the strip line exceeds the saturation threshold of the electric power, an electric power of the magneto-static wave is saturated, so as to maintain a constant amplitude thereof.

The aforesaid saturation of the electric power of the magneto-static wave propagating through the ferri-magnetic material thin film is caused with the lowest saturation threshold of electric power for a superficial magneto-static wave concentrically propagating along film surfaces and perpendicularly to the applied direction of the DC magnetic field applied in parallel with the film surfaces, in comparison with that as for a volume progressive magneto-static wave extensively propagating within the ferri-magnetic material thin film perpendicularly applied thereon with the DC magnetic field, or as for a volume regressive magneto-static wave extensively propagating within the thin film concerned parallelly applied thereon with the DC magnetic field in the applied direction thereof.

This saturation of the superficial magneto-static wave with the lowest saturation threshold of electric power is based, as is apparent from $\Omega - \Omega_H$ characteristic curves of the magneto-static waves of various kinds indicated in FIG. 1 showing the mutual relation between the applied magnetic field intensity and the frequency, on the facts that a generating region of the superficial magneto-static wave extensively overlaps with a generating region of the $\omega/2$ spin wave, which principally causes the saturation with a low electric power, and that the superficial magneto-static wave propagates, as described above, in the state such as the energy thereof is concentrated in the vicinity of the film surfaces, such as, even if those magneto-static waves have the same electric power with each other, the magnetic field generated by the former is more intense than that generated by the latter.

In this connection, FIG. 2 schematically shows an outlined arrangement of the magnetic-static wave device in general including the S/N enhancer, for converting the supplied electro-magnetic wave into the magneto-static wave propagating through the ferri-magnetic material thin film. In the magneto-static wave device as shown in FIG. 2, a coupling strip line 1 for converting an electro-magnetic wave supplied thereon into a magneto-static wave is disposed on a dielectric material substrate 4 backed with an earthed (ground) plate 3 and is coupled with a thin film 6 of ferri-magnetic material, for instance, yttrium-iron-garnet (YIG) which is disposed on a substrate 5 of ferri-magnetic material, for instance, gadolinium-gallium-garnet (GGG) and further is applied with a DC magnetic field $H_o$. The electro-magnetic wave propagating along the coupling strip line 1 from an input terminal ① to an output terminal ② is converted, on the way, into a magneto-static wave propagating through the ferri-magnetic material thin film 6, and is further coupled with a terminating strip line provided at the end thereof, so as to be absorbed by a load resistance connected therewith, or so as to be absorbed as the propagation loss in the long path for the magneto-static wave.

In this connection, as described later in detail, when the impedance Z in view of the ferri-magnetic material film from the mid-point between the input terminal ① and the output terminal ② is considered, in a state where the electric power P of the supplied electro-magnetic wave is smaller than Pc of the saturation threshold, $Z = Z_{MSW}$ is obtained as for the radiation impedance $Z_{MSW}$ into the magneto-static wave in the state where the non-linear characteristic is not presented, while $Z < |Z_{MSW}|$ is obtained in another state where the electric power P of the former is larger than Pc of the latter. So that, when the load $R_L$ is connected with the output terminal ② of the coupling strip line 1 in the magneto-static wave device as shown in FIG. 2, the attenuation from the input terminal ① to the output terminal ② of the coupling strip line 1 in the case $P > P_c$ is decreased in response to the tendency that both terminals are short-circuited. As a result, the signal components having the larger power are intensified, while noise components having the smaller power are not intensified, so as to improve the signal-to-noise ratio (S/N).

Figure 3B:
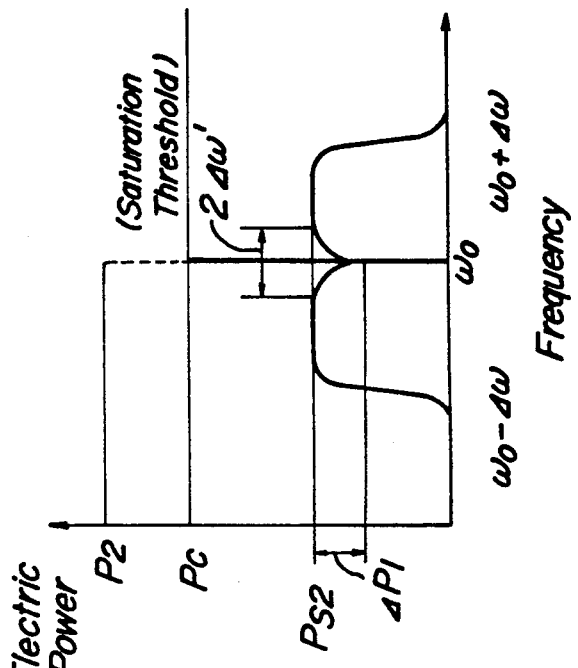

Now, it is assumed that the electro-magnetic wave supplied to the electro-magnetic wave-to-magneto-static wave converter formed of the magneto-static wave device, comprises a signal carrier having an angular frequency $\omega_o$ and an electric power $P(\omega_o)$ and noise components having electric power $P_S(\omega_o+\Delta\omega)$, which is smaller than $P(\omega_o)$ in the spectrum $\omega_o+\Delta\omega$. FIGS. 3(a) and 3(b) show the carrier power $P(\omega_o)$ supplied to the magneto-static wave device as indicated by big solid lines and the residual power $P_s(\omega_o+\Delta\omega)$ including sideband components and spectrum components respectively. The state where the input carrier power $P_1(\omega_o)$ does not reach the saturation threshold power $P_c$ is shown in FIG. 3(a). In this state, the carrier power $P(\omega_o)$ is entirely converted into the magneto-static wave, so that it can be regarded that the radiation impedance from the magneto-static wave device is matched with the terminal impedance W of the electro-magnetic wave supplying source. In this connection, the sideband spectrum component power $P_s(\omega_o+\Delta\omega)$ is the power $P_{s1}$ shown in FIG. 3(a).

On the other hand, in the state where the input carrier power $P_2(\omega_o)$ exceeds the saturation threshold power $P_c$, as shown in FIG. 3(b), the electric power to be converted into the magneto-static wave does not exceed the saturation threshold power $P_c$ as shown in FIG. 4, so as to become a constant value equal to $P_c$. In other words, in the state where the input carrier power exceeds the saturation threshold power $P_c$ and hence the magnetic field intensity generated by the converted magneto-static wave exceeds the magnetic field intensity $h_c$ corresponding to the saturation threshold power $P_c$, a spin wave having an angular frequency $\omega_o/2$ is generated by the parametric effect based on the non-linear characteristic of the ferri-magnetic material (e.g. ferrite), and hence the energy of the input carrier is absorbed into the generation of the spin wave. So that, the magnetic field generated by the magneto-static wave and the magnetization accompanied thereby are reduced according to the attenuation term of the equation of motion and hence the circular motion of the spin wave tends towards the reduction. On the contrary, the energy for overcoming this attenuating tendency is supplied from the input carrier power P, so as to attain the mutual balance. As a result, the electric power to be converted into the magneto-static wave becomes constant. In this connection, the energy of the spin wave which is generated as described above is consumed as heat, so that, when the input carrier power P exceeds the saturation threshold power $P_c$, the excessive input carrier power over the saturation threshold power $P_c$ is entirely supplied for the generation of the spin wave, as shown in FIG. 4. Accordingly, the more the input carrier power P is increased, the more the energy supplied for generating the spin wave is increased in response to the difference $P-P_c$, so as to be consumed as heat.

Now, in the magneto-static wave device as shown in FIG. 2, when the terminal voltage between the input terminal ① of the strip line 1 and the earthed plate 3 connected with the output terminal ② thereof is assumed as V, this terminal voltage V does not exceed the saturated voltage $V_c$, because, even if the input carrier power P exceeds the saturation threshold power $P_c$, the magnitude of magnetization is not varied constantly. So that, when the conductance based on the input carrier power converted into the spin wave through the coupling strip line 1 is assumed as $G_{spin}$, the following equation (1) is obtained.

$$G_{spin} = \frac{P - P_c}{V_c^2} \tag{1}$$

As described above, the terminal voltage V is always kept at a constant value equal to the saturation threshold voltage $V_c$, even if the carrier power P exceeds the saturation threshold power $P_c$. So that, the spin wave conversion conductance $G_{spin}$ should be connected in parallel with the magneto-static wave conversion conductance $G_{MSW}$, as shown in FIG. 5(a), by closing the switch $S_W$ in the equivalent circuit, when the carrier power P exceeds the saturation threshold power $P_c$, namely $P > P_c$. Accordingly, the input terminal conductance G of the magneto-static wave device can be expressed by the following equation (2).

$$G = G_{MSW} \text{ when } P < P_c \tag{2}$$

$$G = G_{MSW} + \frac{P - P_c}{V_c^2} \text{ when } P > P_c$$

So that, in the situation where $P > P_c$, the input terminal conductance G is increased in response to the increase of the carrier power P, as shown in FIG. 6.

In this connection, FIG. 5(b) shows an equivalent circuit in which the magneto-static wave device is serially connected with the load resistance $R_L$. So that, when the carrier signal power supplied to the load resistance $R_L$ is assumed as $P_L$, this load power $P_L$ is rapidly increased in the state where the carrier power P exceeds the saturation threshold power $P_c$. The ratio between the load power $P_L$ and the input carrier power $P_{in}$ can be expressed by the following equation (3).

$$\frac{P_L}{P_{in}} = 1 - \frac{1}{1 + R_L \cdot \frac{P}{V_c^2}} = \frac{R_l \cdot \frac{P}{V_c^2}}{1 + R_L \cdot \frac{P}{V_c^2}} \tag{3}$$

On the contrary, when $P < P_c$, the following equation (4) is naturally obtained.

$$\frac{P_L}{P_{in}} = \frac{R_L}{R_L + R_{MSW}} \tag{4}$$

Consequently, when the signal power is assumed as S and the noise power is assumed as N and further the condition of the following equation (5) is employed, $$\left.\begin{array}{l} S > P_c \\ N < P_c \end{array}\right\} \tag{5}$$

According to the above equations (3) and (4), the S/N improving degree I can be expressed by the following equation (6), as for $(S/N)_E$ which is S/N with the enhancer employed.

$$I = \frac{\left(\frac{S}{N}\right)_E}{\left(\frac{S}{N}\right)_O} = \left(1 - \frac{1}{1 + R_L \cdot \frac{P}{V_c^2}}\right)\left(1 + \frac{R_{MSW}}{R_L}\right) \quad (6)$$

Furthermore, when $P_{in} \to \infty$, the following equation (7) is obtained.

$$I = 1 + \frac{R_{MSW}}{R_L} \quad (7)$$

Consequently, to increase the S/N an improving degree, the condition $R_{MSW} >> R_L$ should be attained. However, the maintenance of this condition is troublesome for providing a practical circuit arrangement.

So that, it is enough to avoid the above trouble by providing a practical circuit to further decrease only the noise having the smaller power, and hence the S/N enhancer as mentioned in the beginning has been conventionally developed. In this conventional S/N enhancer, an input carrier signal is branched into two channels of the 1st and the 2nd. In the 1st channel a magneto-static wave device and an attenuator are inserted in this order, while in the 2nd channel another attenuator having the same attenuation as that in the 1st channel and another magneto-static wave device are inserted in this order, outputs of both channels are mixed in opposite phase to each other such that small components including noise should be canceled. So that, in the 1st channel the large power signal components are firstly suppressed at a constant level equal to the saturation threshold power through the magneto-static wave device and thereafter are further reduced through the attenuator, while in the 2nd channel the large power signal components are firstly reduced through the attenuator and thereafter are supplied to the magneto-static wave device, and hence are derived therefrom as those are that do not reach the saturation threshold power level. As a result, in the output of the 1st channel, the signal output level is lower than that of the 2nd channel in response to the constant suppression through the saturation. On the other hand, in the region where, as shown in FIG. 3(b), angular frequencies of side-band components are apart from that of the carrier by more than $\Delta\omega'$, the saturation phenomenon is not caused at all, and hence noise components are canceled with each other and do not appear in the mixed output at all. Meanwhile, as for the signal components mentioned above, the signal output power corresponding to the attenuation through the saturation appears in the mixed output; thus, S/N is largely improved.

In this connection, the band width $\Delta\omega'$ in FIG. 3(b) is proportional to the magnetic resonance half-width $\Delta H$ and the input carrier power P, and, for instance, $\Delta\omega'/2\pi$ when $\Delta H = 1$ oersted, becomes a few MHz.

To avoid the above-noted great insertion loss in the conventional S/N enhancer, the present invention uses the fact that the input impedance of the electro-magnetic wave to magneto-static wave converter employing the magneto-static wave device is varied in response to the magnitude relation between the input carrier power P and the saturation threshold power $P_c$, namely, in response to the relation between $P < P_c$ and $P > P_c$ as shown in the equation (2). According to the present invention, the carrier supplying source is matched to the input terminal impedance for the state where the input carrier power P does not exceed the saturation threshold power Pc, and excessive input carrier power supplied from the supplying source is reflected at the input terminal of the magneto-static wave device because the input terminal of the magneto-state device is mismatched to the input impedance in the state where the input carrier power P exceeds the saturation threshold power Pc. This excessive input carrier power is derived as an output carrier signal through a circulator or a directional coupler, so as to realize an S/N enhancer utilizing a magneto-static wave with slight insertion loss.

In other words, in the embodiment of the S/N enhancer according to the present invention as shown in FIG. 7(a), a high frequency signal supplied to a terminal ① of a circulator 7 is derived from a terminal ② thereof, so as to be supplied to a magneto-static wave device 9 through an impedance matching circuit (N)8. In this arrangement, the matching circuit (N)8 is provided therein to equalize the impedance Z in view of the magneto-static wave device 9 from the coupling strip line 1 in the device 9 concerned, in the state where the input carrier signal power is small, to the impedance W of the circulator 7. So that, in the state where the input carrier signal power is small, the input signal power is entirely absorbed into the magneto-static wave device 9 and into the load resistance W' connected with the terminating strip line through the matching circuit (N')10. As a result, the signal power does not appear on the output terminal ③ of the circulator 7.

Meanwhile, in the state where the input carrier signal power is large, the electric power of the magneto-static wave converted from the electro-magnetic wave supplied to the input terminal ① of the coupling strip line 1 is saturated, the excessive electric power exceeding the saturation threshold is reflected by the mismatching of the input terminal impedance concerned, and hence appears at the output terminal ③ of the circulator 7 as an output. This output signal electric power $S_{out}$ is expressed by the following equation (8).

$$S_{out} = S \cdot |\Gamma|^2 = S\left\{G_0 - \left(G_{MSW} + \frac{P - P_c}{V_c^2}\right)/G_0 + \left(G_{MSW} + \frac{P - P_c}{V_c^2}\right)\right\}^2 \quad (8)$$

In addition, the output noise power $N_{out}$ in this state is attenuated by the isolation $L_{iso}$ of the circulator or the directional coupler, as expressed by the following equation (9).

$$N_{out} = N \cdot \frac{1}{L_{iso}} \quad (9)$$

The isolation $L_{iso}$ of the circulator or the directional coupler readily becomes 25 dB in general, while $|\Gamma|^2$ becomes a few dB, so that, it is readily attained to improve the signal to noise ratio S/N by more than 20 dB.

In this connection, in the embodiment shown in FIG. 7(b), a 3 dB coupler 11 is employed for the directional coupling circuit, a terminal ② which is opposite to the input terminal ① is connected with a load resistance W through the matching circuit (N)8, while a terminal ④, conjugate to the terminal ②, is, connected with the magneto-static wave device 9, similar to that in FIG. 7(a), so as to derive the output signal from a terminal ③ conjugate to the input terminal ①.

In the embodiment shown in FIG. 7(c), the terminals ② and ④ are conjugate to each other in the 3 dB coupler or the hybrid ring 11, which is arranged similar to that in FIG. 7(b), and are individually connected with magneto-static wave devices 9, similarly as in FIG. 7(a).

Further, in the embodiment shown in FIG. 7(d), for replacing similarly arranged magneto-static wave devices 9 which are individually connected with mutually conjugated terminals ② and ④ of the 3 dB coupler or the hybrid ring in the embodiment shown in FIG. 7(c), magneto-static wave devices similar to those shown in FIG. 7(a) are individually provided on front and rear surfaces of a single ferri-magnetic material thin film 13, so as to be small-sized by utilizing the fact that superficial magneto-static waves propagate in directions opposite to each other along front and rear surfaces of the ferri-magnetic material thin film applied with a DC magnetic field.

In the S/N enhancer utilizing the magneto-static wave according to the present invention, as described earlier by referring to FIG. 3(b), among spectrum components including noise components other than carrier signals, spectrum components in the intermediate vicinities $\pm\Delta\omega'$ of the central angular frequency $\omega_o$ are absorbed into spin waves and hence are consumed as heat, the band width thereof usually being a few MHz as described earlier, being narrowed in response to the magnetic resonance half-width $\Delta H$ and being widened in response to the carrier power P. However, within this angular frequency band width $\Delta\omega'$, because the energy of carrier power is consumed for generating spin waves as described above, the admittance in view of the input terminal of the magneto-static wave device deviates from the value $G_{MSW}$ in the conversion for the magneto-static wave, and is varied as shown in FIG. 8.

Accordingly, for the a signal comprising spectrum components having a band-width B, as shown in FIG. 8 (e.g. a signal applied with the wide-band FM modulation) the following equation (10) can be obtained.

$$2\Delta\omega' << B \qquad (10)$$

As a result, the variation of admittance in the band-width $2\Delta\omega'$ in the vicinity of the carrier becomes negligible in comparison with the band-width B of spectrum components, so that the decrease of S/N improvement which is caused by the admittance variation in the band-width $2\Delta\omega'$ in the vicinity of the carrier in the S/N enhancer utilizing the reflection based on the input admittance variation of the magneto-static wave device according to the present invention is substantially unnecessary to be considered. Particularly, as for a high frequency signal applied in a long distance transmission through a wide-band FM modulation (e.g. satellite broadcasting), the spectrum distribution band-width B=27 MHz is employed, so that it is preferable to use a ferrite thin film in the range $\Delta H < 0.5 \sim 1$ oersted.

As is apparent from the above description, according to the present invention, it is possible to obtain a particularly evident effect based on the utilization of the superficial magneto-static wave which concentrically propagates in the vicinity of the surface of the thin film of ferri-magnetic material (e.g. ferrite) such that the signal to noise ratio S/N of the high frequency signal, particularly a FM-modulated high frequency signal having spectrum components distributed in a wide range, can be greatly improved without any increase of insertion loss and without any influence of the discrepancy of phase characteristic.

What is claimed is:

1. A signal to noise ratio (S/N) enhancer for enhancing an S/N of an electro-magnetic wave supplied by an electro-magnetic wave supplying source having an internal impedance, said S/N enhancer comprising:
   a dielectric material substrate;
   a ferri-magnetic material thin film, having two surfaces and disposed on said dielectric material substrate;
   means for generating a magnetic field substantially parallel to said thin film;
   a first strip line, provided on a first surface of said thin film, for inputting said electro-magnetic wave at one end thereof, said first strip line coupling (i) a superficial magneto-static wave, which propagates substantially perpendicularly to said DC magnetic field along both surfaces of said thin film, and (ii) said electro-magnetic wave; and
   means for substantially matching an impedance of said first strip line to said internal impedance of said electro-magnetic wave supplying source for a state of operation where said electro-magnetic wave has an electric power level less than a saturated electric power level;
   wherein if said electric power level of said electro-magnetic wave is greater than said saturated electric power level, the S/N of said electro-magnetic wave is increased by reflection of said electro-magnetic wave from said one end of said first strip line caused by impedance mismatch between said first strip line and said electro-magnetic wave supplying source.

2. An S/N enhancer as claimed in claim 1, further comprising a second strip line, provided spaced apart from and parallel to said first strip line, for supplying said electro-magnetic wave and said superficial magneto-static wave to an absorbing resistance element.

3. An S/N enhancer as claimed in claim 1, further comprising directional coupling circuit means, for coupling said electro-magnetic wave supplying means and said one end of said first strip line, wherein the electro-magnetic wave reflected from said one end of said first strip line is derived through said directional coupling circuit means.

4. An S/N enhancer as claimed in claim 2, further comprising directional coupling circuit means for coupling said electro-magnetic wave supplying means and said one end of said first strip line, wherein the electro-magnetic wave reflected from said one end of said first strip line is derived through said directional coupling circuit means.

5. An S/N enhancer as claimed in claim 4, wherein said directional coupler comprises a first pair of conjugate terminals and a second pair of conjugate terminals, said electro-magnetic supplying source is connected to one terminal of said first pair of conjugate terminals, and said first strip line is connected to one terminal of said second pair of conjugate terminals.

6. An S/N enhancer as claimed in claim 5, further comprising:
   a second dielectric material substrate;

a second ferri-magnetic material thin film, having two surfaces and disposed on said second dielectric material substrate; and third and fourth strip lines, disposed on said second thin film, wherein said third strip line is connected to a second terminal of said second pair of conjugate terminals.

7. An S/N enhancer as claimed in claim 5, further comprising third and fourth strip lines, disposed on a second surface of said dielectric material substrate, and wherein said third strip line is connected to a second terminal of said second pair of conjugate terminals.

8. An S/N enhancer as claimed in claim 1, wherein said means for generating a magnetic field comprises means for generating a DC magnetic field.

* * * * *